(12) United States Patent
Withers et al.

(10) Patent No.: US 10,268,864 B2
(45) Date of Patent: *Apr. 23, 2019

(54) HIGH-RESOLUTION ELECTRIC FIELD SENSOR IN COVER GLASS

(71) Applicant: QUALCOMM Incorporated, San Diego, CA (US)

(72) Inventors: Richard S. Withers, Sunnyvale, CA (US); Ronald B. Koo, Los Altos, CA (US); Stephen C. Gerber, Austin, TX (US); Arkadii V. Samoilov, Saratoga, CA (US); David Johnson, Cupertino, CA (US)

(73) Assignee: QUALCOMM TECHNOLOGIES, INC, San Diego, CA (US)

(*) Notice: Subject to any disclaimer, the term of this patent is extended or adjusted under 35 U.S.C. 154(b) by 226 days.

This patent is subject to a terminal disclaimer.

(21) Appl. No.: 15/378,897

(22) Filed: Dec. 14, 2016

(65) Prior Publication Data

US 2017/0091513 A1  Mar. 30, 2017

Related U.S. Application Data

(63) Continuation of application No. 14/496,073, filed on Sep. 25, 2014, now Pat. No. 9,558,390.

(Continued)

(51) Int. Cl.
*G01R 27/26* (2006.01)
*G06K 9/00* (2006.01)
(Continued)

(52) U.S. Cl.
CPC ....... *G06K 9/0002* (2013.01); *G01R 27/2605* (2013.01); *G06F 3/017* (2013.01);
(Continued)

(58) Field of Classification Search
USPC .................................. 324/658–686
See application file for complete search history.

(56) References Cited

U.S. PATENT DOCUMENTS 9,342,727 B2    5/2016   Cohen et al.
2007/0001249 A1  1/2007  Chou et al.
(Continued)

FOREIGN PATENT DOCUMENTS

JP         S5368180 A    6/1978

OTHER PUBLICATIONS

International Search Report and Written Opinion—PCT/US2015/041522—ISA/EPO—dated Oct. 12, 2015.
(Continued)

*Primary Examiner* — Vincent Q Nguyen
(74) *Attorney, Agent, or Firm* — Weaver Austin Villeneuve & Sampson LLP

(57) ABSTRACT

A fingerprint sensor is described that includes a thin protective cover layer on a sensor glass layer with receive circuitry between the thin protective cover layer and the sensor glass layer. In an implementation, a fingerprint sensor assembly includes a controller; a metal layer configured to be electrically coupled to the controller; a transmit layer electrically connected to the metal layer and the controller; a sensor glass layer, where the transmit layer is disposed on a first side of the sensor glass layer, and where the transmit layer is electrically coupled to the controller; a receive layer disposed on a second side of the sensor glass layer, where the receive layer is electrically coupled to the controller; and a protective cover layer disposed on the receive layer.

26 Claims, 5 Drawing Sheets

Related U.S. Application Data

(60) Provisional application No. 62/028,887, filed on Jul. 25, 2014.

(51) Int. Cl.
  *G06F 3/01* (2006.01)
  *G02F 1/1333* (2006.01)
  *H01L 27/32* (2006.01)
  *H01L 51/52* (2006.01)

(52) U.S. Cl.
  CPC ...... *G06K 9/00053* (2013.01); *G02F 1/13338* (2013.01); *H01L 27/323* (2013.01); *H01L 51/5237* (2013.01)

(56) References Cited

U.S. PATENT DOCUMENTS

| | | | |
|---|---|---|---|
| 2008/0069588 A1 | 3/2008 | Inaba et al. | |
| 2009/0322705 A1* | 12/2009 | Halsey, IV | G06F 3/044 345/174 |
| 2010/0020473 A1* | 1/2010 | Prymak | H01G 9/012 361/523 |
| 2012/0134549 A1 | 5/2012 | Benkley, III | |
| 2012/0182253 A1 | 7/2012 | Brosnan | |
| 2012/0242635 A1* | 9/2012 | Erhart | G06F 1/1626 345/207 |
| 2013/0265137 A1 | 10/2013 | Nelson et al. | |
| 2013/0287274 A1 | 10/2013 | Shi et al. | |
| 2014/0062875 A1* | 3/2014 | Rafey | G06F 17/276 345/158 |
| 2014/0192007 A1* | 7/2014 | Westhues | G06F 3/044 345/174 |
| 2015/0091182 A1 | 4/2015 | Chiu et al. | |
| 2016/0026842 A1 | 1/2016 | Withers et al. | |

OTHER PUBLICATIONS

Office Action issued in U.S. Appl. No. 14/496,073, dated Jul. 27, 2016.

Notice of Allowance issued in U.S. Appl. No. 14/496,073, dated Nov. 8, 2016.

International Preliminary Report on Patentability—PCT/US2015/041522, the International Bureau of WIPO—Geneva, Switzerland, dated Jan. 31, 2017.

* cited by examiner

HIGH-RESOLUTION ELECTRIC FIELD SENSOR IN COVER GLASS

CROSS-REFERENCE TO RELATED APPLICATIONS

This application is a continuation of U.S. application Ser. No. 14/496,073, filed Sep. 25, 2014, entitled "HIGH-RESOLUTION ELECTRIC FIELD SENSOR IN COVER GLASS," which claims the benefit under 35 U.S.C. § 119(e) of U.S. Provisional Application No. 62/028,887, filed Jul. 25, 2014, entitled "HIGH-RESOLUTION ELECTRIC FIELD SENSOR IN COVER GLASS," both of which are assigned to the assignee hereof and expressly incorporated herein by reference.

Electronic devices utilizing a touchscreen are prevalent in today's technology. Electronic devices using a touchscreen can include, for example, a smartphone, a smartwatch, or a tablet computer. A touchscreen can include an electronic visual display that a user can control through simple or multi-touch gestures by touching the screen, for example with a finger. The user can use the touchscreen to react to what is displayed and to control how it is displayed (for example by zooming the text size). The touchscreen enables the user to interact directly with what is displayed, rather than using a mouse, touchpad, or any other intermediate device (other than a stylus, which is optional for most modern touchscreens).

Fingerprint sensors can include a device used to capture an image of a fingerprint pattern. These fingerprint patterns can be used to create a representative template, which can be stored and used for matching an individual's fingerprint.

SUMMARY

A high-resolution electric-field sensor fabricated on a cover glass is described. The cover glass is placed above a display to protect the display device from scratches, breakage, and other damage. The high-resolution electric-field sensor can resolve the fine features of a fingerprint on the cover glass while still imaging fingers, styli, palms, and human body parts both on the cover glass and above the cover glass. The cover glass retains its strength, scratch resistance, and transparency even in the presence of the high-resolution electric-field sensor. The result is that sensing of many different objects can be done above the display.

Accordingly, a fingerprint sensor is described that includes a thin protective cover layer on a sensor glass layer with receive circuitry between the thin protective cover layer and the sensor glass layer. In an implementation, a fingerprint sensor assembly includes a controller; a metal layer configured to be electrically coupled to the controller; a transmit layer electrically connected to the metal layer and the controller; a sensor glass layer including at least one through-glass via, where the transmit layer is disposed on a first side of the sensor glass layer, and where the transmit layer is electrically coupled to the at least one through-glass via; a receive layer disposed on a second side of the sensor glass layer, where the receive layer is electrically coupled to the at least one through-glass via; and a protective cover layer disposed on the receive layer.

In an implementation, a cover glass assembly with a high-resolution electric field sensor that employs example techniques in accordance with the present disclosure includes a transmit layer electrically connected by a metal layer to a controller; a sensor glass layer including at least one through-glass via, where the transmit layer is disposed on a first side of the sensor glass layer and is electrically coupled to the at least one through-glass via; a receive layer disposed on a second side of the sensor glass layer, where the receive layer is electrically coupled to the at least one through-glass via; and a protective cover layer disposed on the receive layer, where the cover glass device is configured to include a touch-panel device.

In an implementation, a cover glass assembly with a high-resolution electric field sensor that employs example techniques in accordance with the present disclosure includes a display assembly configured for a mobile device; a transmit layer electrically connected by a metal layer to a controller, where the controller is electrically coupled to the display assembly; a sensor glass layer including at least one through-glass via, where the transmit layer is disposed on a first side of the sensor glass layer and is electrically coupled to the at least one through-glass via; a receive layer disposed on a second side of the sensor glass layer, where the receive layer is electrically coupled to the at least one through-glass via; and a protective cover layer disposed on the receive layer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
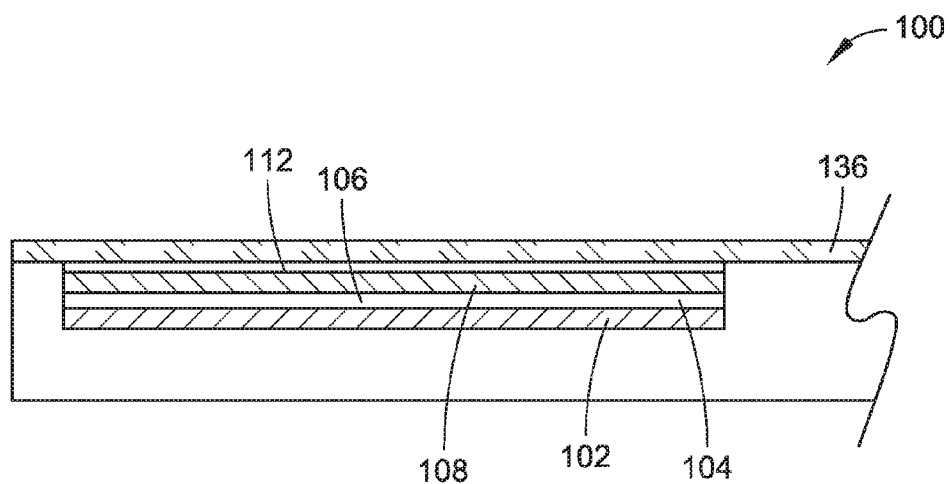
FIG. 1 is a partial cross section side view illustrating an embodiment of a touch panel device that includes a thick protective cover layer and sensor glass.

Some existing smartphones and computing devices have added fingerprint sensors in the home buttons or on the back side. Generally the design trend is for the display area to increase to the edges of the front face and potentially wrap around the sides. In the future, the physical home button may no longer exist, and the fingerprint sensor may need to be over the display area and may need to co-exist with a touch sensor, a stylus sensor, a hover sensor, and/or a gesture sensor.

A fingerprint sensor may have low sensitivity due to thick cover glass (e.g., sometimes 0.5-0.7 mm). In particular, the sensitivity of these fingerprint sensors with thick protective cover glass may be too low for accurate fingerprint detection above the display with indium tin oxide layers traditionally placed under the protective cover glass.

A fingerprint sensor is described capable of imaging fingerprints sensed by the fingerprint sensor and cover glass device, capacitive imaging of motion of multiple fingers in contact with the fingerprint sensor and cover glass device, capacitive imaging of approximate positions of fingers ("hovering") above the fingerprint sensor and cover glass device, and motions ("gestures") of hands in proximity to the fingerprint sensor and cover glass device. The fingerprint sensor and touch panel device disclosed herein provide improved sensitivity by placing a receive layer between the sensor glass layer and the protective cover layer and bringing the leads from the receive layer to a transmit layer on the opposite side of the sense glass by way of through-glass vias in the sensor glass layer. Additionally, the fingerprint sensor and cover glass device provide a thinner fingerprint sensor and faster fingerprint detection because of the thin protective cover layer and the through-glass via configuration.

A capacitive touch sensor typically is constructed to provide mutual capacitance between transmit rows (parallel to "x") and receive columns (parallel to "y"). The transmit rows and receive columns can be at the same distance from the top surface (e.g., protective cover layer 136) of the sensor, or the receive columns can be closer to the top surface. In implementations, typical thicknesses of a protective cover glass can be 0.4 to 0.7 mm. A controller integrated circuit provides signals (typically in the 50-KHz to 10-MHz frequency range) to the transmit rows and detects changes in mutual capacitance to the receive columns from the amplitude and phase of the received signals. These changes in mutual capacitance represent the presence of a finger, stylus, and/or object in the vicinity of the pixels defined by the intersection of a transmit row and receive column. In implementations, the spatial period ("pitch") of a touch sensor can typically be about 5 mm.

The tip of a stylus is often smaller than a fingertip, typically 1 to 2 mm in diameter. Thus, a touch sensor can often be optimized for finer spatial resolution in order to better localize the position of the stylus. The touch sensor pitch may be about 5 mm, but it uses knowledge of the spatial sensitivity of a single pixel and neighboring pixels to better locate the stylus. Cover glass thicknesses can be 0.4 mm to 0.7 mm, which is similar to the thickness of a capacitive touch sensor.

A fingerprint sensor must be able to detect and image the ridges and valleys of a fingerprint. These fingerprint features have a pitch of a few hundred microns (e.g., 400 µm), and the valleys are a few hundred microns below the ridges. A finer fingerprint sensor pitch is needed to form an accurate image of these fingerprint features. The industry standard (and required for certain government applications) is a pitch of 50 microns, nearly 100 times less than the 5-mm pitch of typical touch sensors. Capacitive sensing of the fine ridges and valleys of a fingerprint requires a cover glass that is considerably thinner than the 0.4 to 0.7 mm that is standard for touch sensors.

A hover sensor must detect the presence of a finger that is a few to several centimeters above the hover sensor. It needs to give the approximate position of the finger in x and y coordinates. Often, the hover sensor can include a touch panel operated in a different, low-spatial-resolution mode. This might be achieved, for example, by ganging together multiple transmit and receive elements. A gesture sensor can include an extension of a hover sensor for detecting and classifying motions of a hand on or above a touch panel.

However, some touch panels cannot resolve the fine features of a fingerprint, simply because, with a typical pitch of 5 mm, they grossly spatially undersample fingerprint ridges that have a pitch around 400 um.

Existing capacitive fingerprint sensors can include silicon integrated circuits. Silicon integrated circuits are opaque and cannot be placed over a display, which is where a fingerprint sensor needs to be in order to function. Other fingerprint sensors that use optical techniques need a large distance between the fingerprint and the camera and thus are totally unsuitable for mobile devices.

The fingerprint sensor disclosed herein solves the sensing of a fingerprint by using a transmit and receive pitch of about 50 to 100 microns, moving the transmit layer and especially the receive layer closer to the actual finger, and using a hard and virtually scratchproof material for the protective cover glass. The receive layer should be less than 100 microns away from the finger for obtaining the best fingerprint image.

Accordingly, a fingerprint sensor is described that includes a thin protective cover layer on a sensor glass layer with receive circuitry between the thin protective cover layer and the sensor glass layer. In an implementation, a fingerprint sensor assembly includes a controller; a metal layer configured to be electrically coupled to the controller; a transmit layer electrically connected to the metal layer and the controller; a sensor glass layer including at least one through-glass via, where the transmit layer is disposed on a first side of the sensor glass layer, and where the transmit layer is electrically coupled to the at least one through-glass via; a receive layer disposed on a second side of the sensor glass layer, where the receive layer is electrically coupled to the at least one through-glass via; and a protective cover layer disposed on the receive layer. In implementations, a cover glass assembly with a high-resolution electric field sensor that employs example techniques in accordance with the present disclosure includes a transmit layer electrically connected by a metal layer to a controller; a sensor glass layer including at least one through-glass via, where the transmit layer is disposed on a first side of the sensor glass layer and is electrically coupled to the at least one through-glass via; a receive layer disposed on a second side of the sensor glass layer, where the receive layer is electrically coupled to the at least one through-glass via; and a protective cover layer disposed on the receive layer, where the cover glass device is configured to include a touch-panel device. In implementations, a cover glass assembly with a high-resolution electric field sensor that employs example techniques in accordance with the present disclosure includes a display assembly configured for a mobile device; a transmit layer electrically connected by a metal layer to a controller, where the controller is electrically coupled to the display assembly;

a sensor glass layer including at least one through-glass via, where the transmit layer is disposed on a first side of the sensor glass layer and is electrically coupled to the at least one through-glass via; a receive layer disposed on a second side of the sensor glass layer, where the receive layer is electrically coupled to the at least one through-glass via; and a protective cover layer disposed on the receive layer.

Example Implementations

Figure 2:
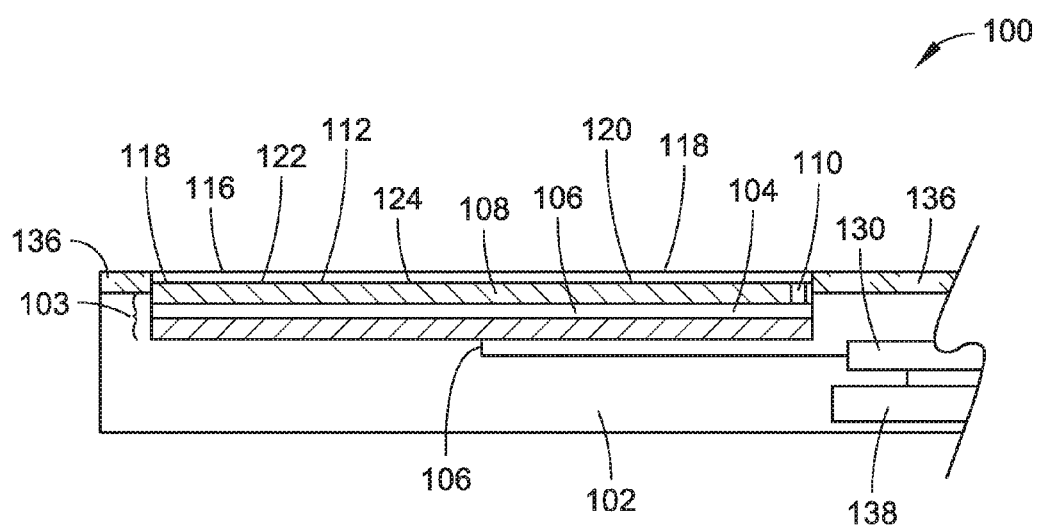
FIG. 2 is a partial cross section side view illustrating an embodiment of a touch-panel device and/or cover glass device that includes a thin protective cover layer and sensor glass with through-glass vias, in accordance with an example implementation of the present disclosure.

FIGS. 1 and 2 illustrate a cross section view of a fingerprint sensor 100. A fingerprint sensor 100 can include a fingerprint sensor assembly, a cover glass assembly, and/or a fingerprint sensing mobile device. As illustrated in FIGS. 1 and 2, the fingerprint sensor 100 can include a transmit layer 104, a sensor glass layer 108, a receive layer 112, and a protective cover layer 116. The transmit layer 104 (e.g., disposed on a first side of the sensor glass) can function to drive a strong electric field into the region above the receive layer 112. In one specific embodiment, the transmit layer 104 can include a layer of indium tin oxide (ITO) rows. Indium tin oxide can serve as a good signal routing layer due to its electrical conductivity and optical transparency. Additionally, in embodiments, indium tin oxide can be formed as a thin film. The indium tin oxide layer can be deposited using techniques such as physical vapor deposition, electron beam evaporation, and/or sputtering. In some additional embodiments, the transmit layer 104 can include metal mesh, silver nanowires, and/or carbon nanotubes.

In implementations, the transmit layer 104 can be electrically coupled to a metal layer 106, which can be formed using techniques, such as lithography, deposition, and etching on a small scale, or other techniques such as placing wiring for a larger scale. The metal layer 106 can function to connect the supplies, inputs, and outputs of the controller 130 to the receive layer 112, transmit layer 104, or a flexible flat cable and/or a flexible printed circuit board. The flexible printed circuit board and/or metal layer 106 can connect the controller 130 to a printed circuit board 138, for example. As represented in FIG. 2, 138 can include a flexible printed circuit board and/or a printed circuit board. Additionally, the controller 130 can detect the changes in mutual capacitance between the lines on the receive layer 112 and the lines on the transmit layer 104. In embodiments, the metal layer 106 can include any suitable conductive material, such as wires of copper, aluminum, etc.

The fingerprint sensor 100 can include a sensor glass layer 108, as illustrated in FIGS. 1 and 2. In implementations, the sensor glass layer 108 can include a thin glass substrate configured to let light pass from a display assembly 102 through the fingerprint sensor 100 to a user while providing mechanical support. In some embodiments, a sensor glass layer 108 thickness of about 400 microns can provide both strength and an adequate spatial modulation transfer function for the transmit layer 104. It is contemplated that the sensor glass layer 108 can be of varying thickness (e.g., 300 microns, 500 microns, etc.). In one specific embodiment, the sensor glass layer 108 includes a thin glass substrate, such as an alkali-aluminosilicate sheet toughened glass manufactured through immersion in a molten alkaline salt bath using ion exchange to produce compressive residual stress at the surface. In another embodiment, the sensor glass layer 108 can include soda-lime-silica glass. It is contemplated that other types of glass may also be utilized. The sensor glass layer 108 can be chosen and/or configured for breakage resistance. If additional strength is desired, the fingerprint sensor 100 can, in some embodiments, include at least one additional sensor glass layer 108. In a specific embodiment, a second sensor glass layer 108 can be laminated between the transmit layer 104 and the metal layer 106 for additional strength. In one specific embodiment, the transmit layer 104 can include a wiring pattern that includes a controller 130 in a chip-on-glass configuration and/or a ribbon cable configured to receive from and/or transmit signals to a motherboard or other device.

The sensor glass layer 108 can include at least one through-glass via 110. In implementations, a through-glass via 110 can include a through substrate via in the sensor glass layer 108. The through-glass via 110 can be backfilled with a conductive material, for example copper, or coated with a conductive material. The copper and/or conductive material can be electrically coupled to the transmit layer 104 and/or a receive layer 112. In one specific example, the at least one through-glass via 110 can include a metal-filled blind via that extends from the first side of the sensor glass layer 108 to the second side of the sensor glass layer 108, where the metal-filled blind via is configured to provide capacitive coupling between the transmit layer 104 and the receive layer 112. A blind via can include a via that is exposed on only one side of the sensor glass layer 108. In one example, the through-glass via 110 can be laser-drilled. In some implementations, the fingerprint sensor 100 can include multiple through-glass vias 110 disposed in a bezel area (e.g., the outer area and/or area proximate to the edge of the fingerprint sensor 100) that bring receive signals from the receive layer 112 to the transmit layer 104. Utilizing a through-glass via 110 can function to take leads from a transmit layer 104 on a first side of the sensor glass layer 108 to a receive layer 112 on a second side of the sensor glass layer 108 and eliminate flex cables and obviate awkward wiring on the receive layer 112 side (e.g., side of the sense glass 108 distal from the transmit layer 104) of the sensor glass layer 108. Bringing the receive signals from the receive layer 112 to the transmit layer 104 through the through-glass via(s) 110 provides a neater, thinner, and more compact assembly.

The fingerprint sensor 100 can include a receive layer 112 disposed on the sensor glass layer 108. The receive layer 112 functions to sense the change in capacitance due to a fingerprint, touch, stylus, hovering finger, or gesturing hand. In implementations, the receive layer 112 can include a transparent conductor, such as indium tin oxide (ITO), which can be patterned on the surface of the sensor glass layer 108. The receive layer 112 can be deposited using techniques such as physical vapor deposition, electron beam evaporation, and/or chemical vapor deposition. The receive layer 112 can be configured to route signals and/or provide electrical communication to and/or from the transmit layer 104 by way of at least one through-glass via 110.

The fingerprint sensor 100 can include a protective cover layer 116 disposed on the receive layer 112 and sense glass layer 108. The protective cover layer 116 can include a protective layer and/or cover layer for the fingerprint sensor 100 and can be scratch-resistant as well as provide insulation for the receive layer 112. In one specific embodiment, the protective cover layer 116 can include a thin single crystal layer, such as sapphire, which may be laminated on the receive layer 112 and the sensor glass layer 108. Sapphire is a hard natural material and can be difficult to scratch. Sapphire can function well as a protective cover layer 116. In one specific embodiment where the protective cover layer 116 includes sapphire, the single crystal sapphire layer can be approximately 100 µm to approximately 200 µm in thickness. In another specific embodiment, the protective cover layer 116 can include a hard thin film. In this specific embodiment, the protective cover layer 116 can include, for example, silicon nitride, aluminum oxide, silicon carbide, and/or diamond. In one specific embodiment, a protective cover layer 116 includes a layer of aluminum oxide with a thickness of about one µm. In implementations, a protective cover layer 116 including a hard thin film can be a conformal coating in full contact with the sensor glass layer 108 and/or the receive layer 112 (e.g., the indium tin oxide layer).

The protective cover layer 116 may serve as a protective coating and/or an anti-reflective coating for the fingerprint sensor 100. The protective cover layer 116 functions as a touch surface upon which a user can use one or more fingers, a stylus, and so forth to input commands to the touch screen device 100. In some implementations, the protective cover layer 116 is an at least substantially transparent dielectric. Utilizing a thin protective cover layer 116 can allow the receive layer 112 to be disposed within several hundred microns, tens of microns, or even a few microns of a user's finger or stylus. The high dielectric constants of sapphire and/or the thin film further enhance sensitivity.

As shown in FIG. 1, the fingerprint sensor 100 may include a display assembly 102 (e.g., a liquid crystal display (LCD) and/or an organic light-emitting diode (OLED)). In an implementation using an LCD, a display assembly 102 can include a display that employs the light modulating properties of liquid crystals. LCD displays can utilize two sheets of polarizing material with a liquid crystal solution between them. An electric current passed through the liquid causes the crystals to align so that light cannot pass through them. Each crystal functions as a shutter either allowing light to pass through or blocking the light. Some embodiments of a display assembly 102 can include a video display, a flat panel display, an electronic visual display, a computer monitor, and/or an active-matrix organic light-emitting diode. In another specific embodiment, a display assembly 102 can include an active-matrix organic light-emitting diode utilized in a smartphone or tablet computer. Some other examples of a display assembly 102 can include an electroluminescent display (ELD) or a plasma display panel.

In the embodiment illustrated in FIG. 2, the fingerprint sensor 100 can include a display assembly 102 (e.g., a liquid crystal display) with a sensor glass layer 108 disposed on the display assembly 102. In this embodiment, a receive layer 112 and a transmit layer 104 can be patterned into a first layer 122 (e.g., a single indium tin oxide layer including the receive layer 112 and the transmit layer 104) on the sensor glass layer 108 with conductive bridge(s) 118 formed in a second layer 124 of indium tin oxide (or other suitable material). The first layer 122 can be physically and/or electrically separated from the second layer 124 by at least one dielectric patch 120 (e.g., a thin-film patch) at each row/column intersection, which can make the columns of the receive layer 112 continuous.

Figure 3:
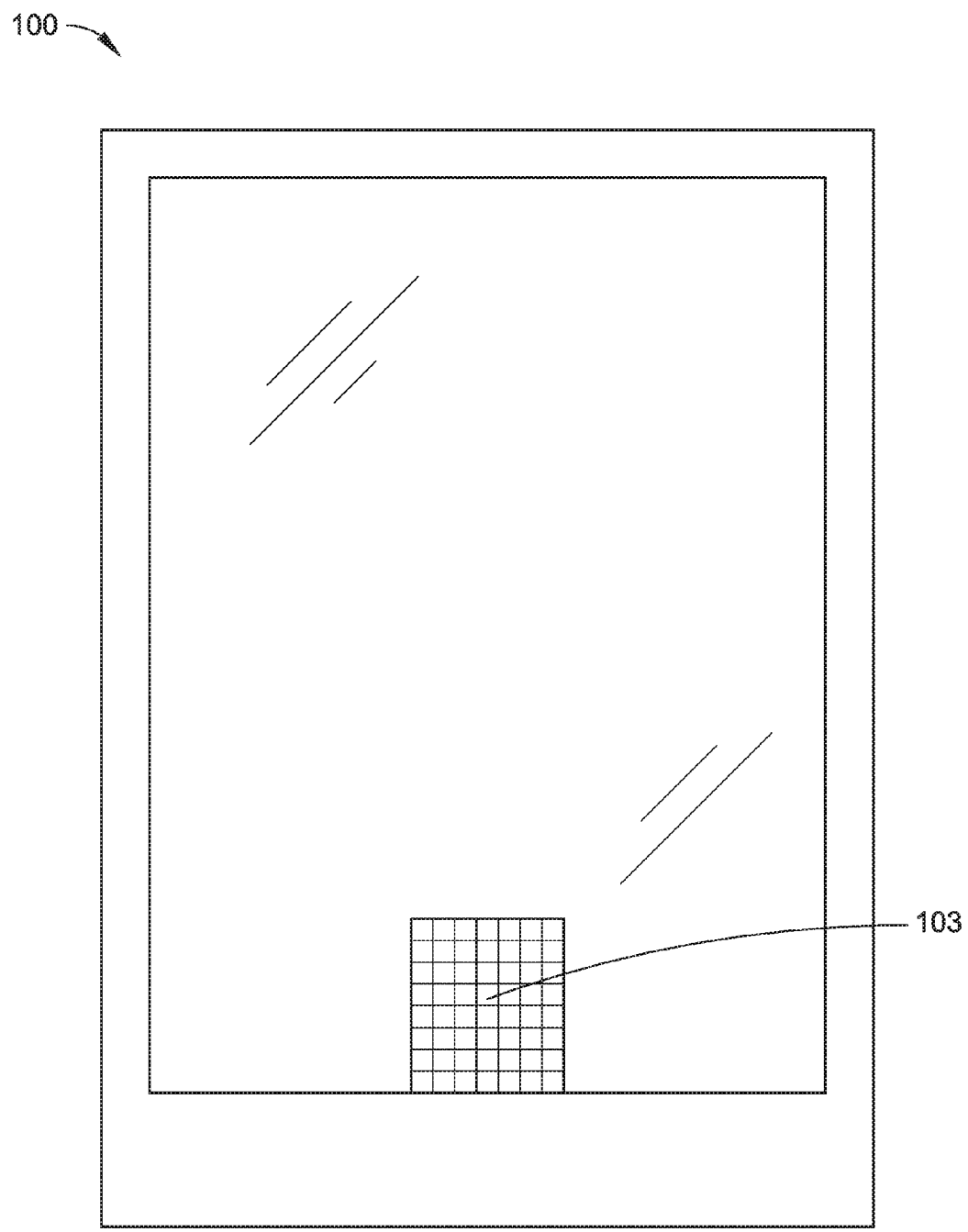
FIG. 3 is a front view illustrating an embodiment of a touch-panel device and/or a cover glass device that includes a fingerprint sensor in the bottom center portion of the cover glass device, in accordance with an example implementation of the present disclosure.
Figure 4:
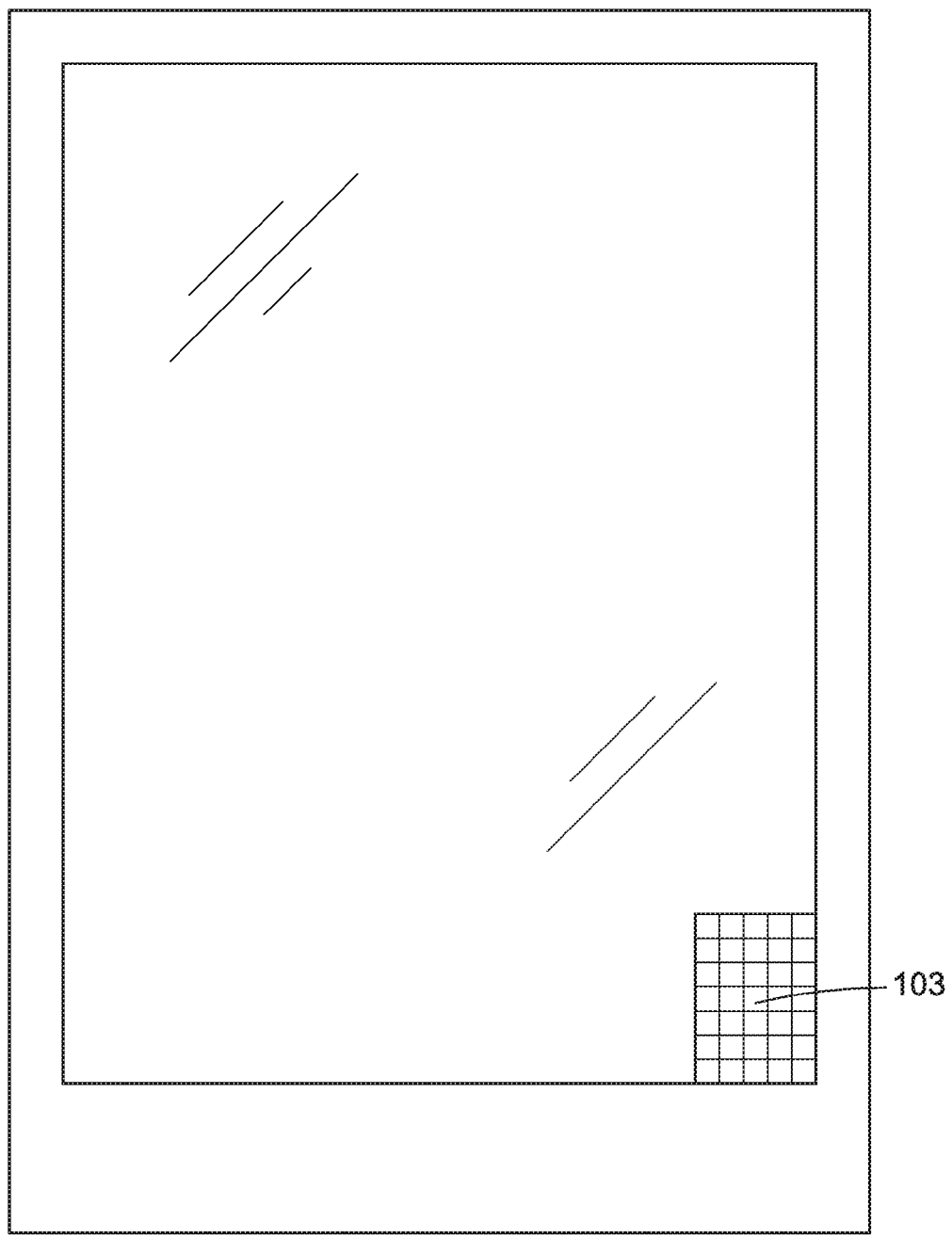
FIG. 4 is a front view illustrating an embodiment of a touch-panel device and/or a cover glass device that includes a fingerprint sensor in the bottom right portion of the cover glass device, in accordance with an example implementation of the present disclosure.

The fingerprint sensor 100 can sense touch, styli, hover, and gestures. This is done by electrically ganging the transmit layer 104 (e.g., transmit rows) and also ganging the receive layer 112 (e.g., receive columns) to form wider sensing elements. In some implementations, such as those shown in FIGS. 3-4, the fingerprint sensing portion 103 can be limited to a small area of the fingerprint sensor 100 and protective cover layer 116. In these implementations, an example 1 cm$^2$ fingerprint sense area may provide adequate fingerprint sensing with a pitch of 50 microns, which can require about 200 transmit lines and about 200 receive lines. Each of these lines can be electrically and/or physically connected to a contact pad on a controller 130.

Figure 5:
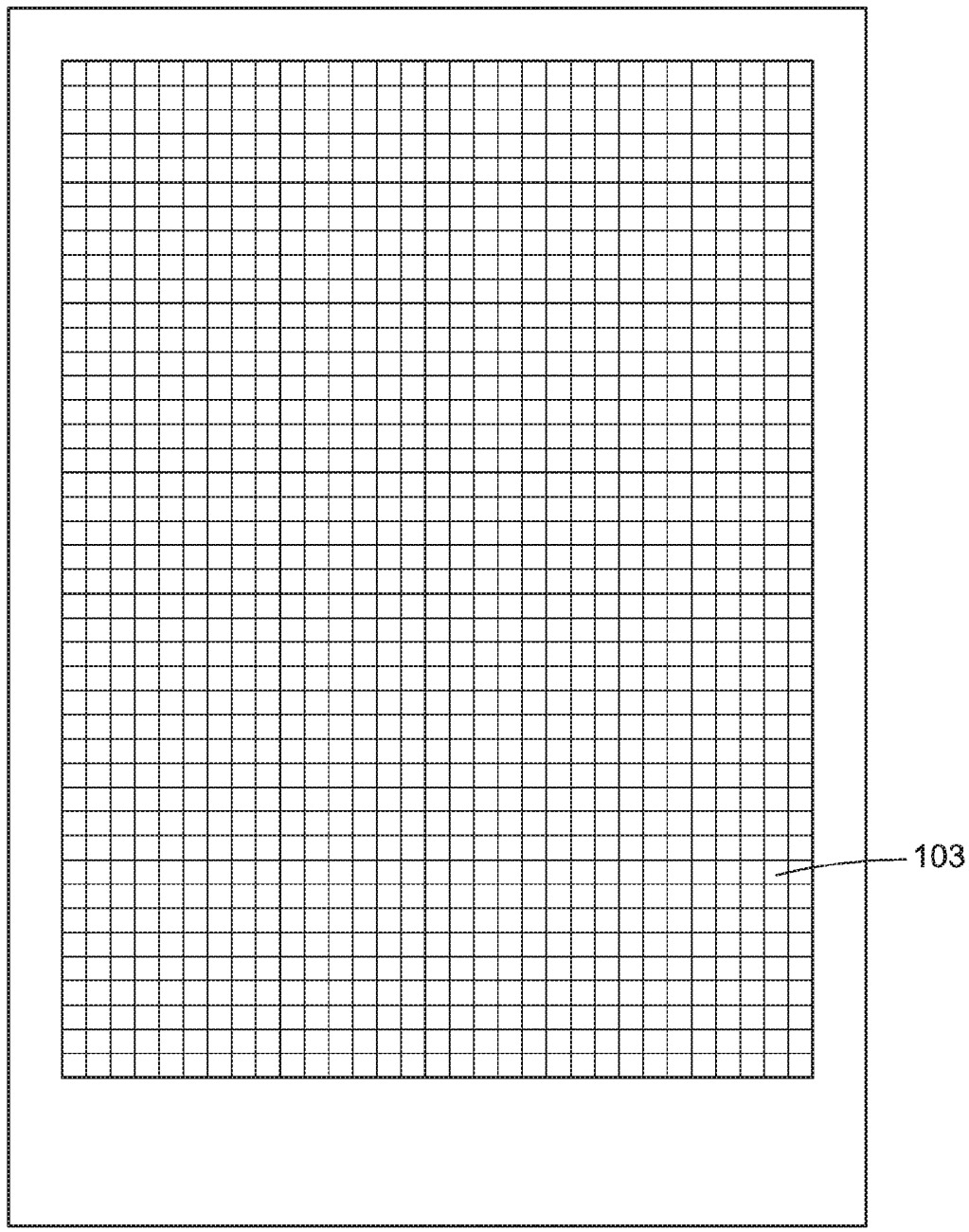
FIG. 5 is a front view illustrating an embodiment of a touch-panel device and/or a cover glass device that includes a fingerprint sensor in the entire portion of the cover glass device, in accordance with an example implementation of the present disclosure.

In some implementations, the fingerprint sensing portion 103 of an overall device (e.g., smartphone, tablet computer, etc.) can include a larger portion of the entire cover glass device, such as the touch-panel device shown in FIG. 5. A larger area fingerprint sensor 100 may enable expanded functionality.

Figure 6:
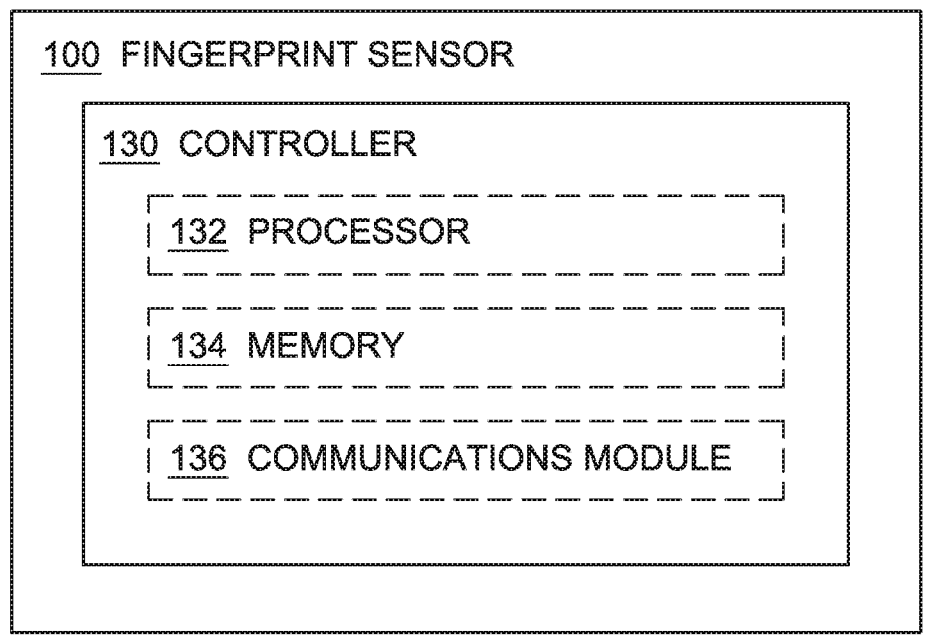
FIG. 6 is a diagram illustrating an embodiment of a fingerprint sensor that includes a sensor glass layer with through-glass vias and a thin protective cover layer, in accordance with an example implementation of the present disclosure

As shown in FIG. 6, the fingerprint sensor 100 can include a controller 130 configured to authenticate a user. The controller 130 may further include a processor 132, a communications module 136, and/or memory 134. In implementations, the processor 132 can provide processing functionality for the controller 130 and may include any number of processors, micro-controllers, or other processing systems and resident or external memory for storing data and other information accessed or generated by the controller 130. The processor may execute one or more software programs, such as a fingerprint sensing application, which implement techniques described herein. The processor 132 is not limited by the materials from which it is formed or the processing mechanisms employed therein, and as such, may be implemented via semiconductor(s) and/or transistors (e.g., using electronic integrated circuit (IC) components), and so forth.

The communications module 136 can be operatively configured to communicate with components of the fingerprint sensor 100 and/or system host. The communications module 136 can also be communicatively coupled with the processor 132 (e.g., for communicating inputs from the fingerprint sensor 100 to the processor 132). The communications module 136 and/or the processor 132 can also be configured to communicate with a variety of different networks, including the Internet, a cellular telephone network, a local area network (LAN), a wide area network (WAN), a wireless network, a public telephone network, and/or an intranet, for example. In one implementation, the communications module 136 can include sensing lines between components of the fingerprint sensor 100.

The memory 134 is an example of tangible computer-readable media that provides storage functionality to store various data associated with operation of the controller 130, such as software programs and/or code segments, algorithms, or other data to instruct the processor 132 and/or other components of the controller 130 to perform the steps and/or functions described herein. Thus, the memory 134 can store data, such as a program of instructions for operating a fingerprint sensor 100 (including its components), data, and so on. Although a single memory 134 is described, a wide variety of types and combinations of memory (e.g., tangible memory, non-transitory) may be employed. The memory 134 may be integral with the processor 132, may comprise stand-alone memory, or may be a combination of both.

The memory 134 may include removable and non-removable memory components, such as Random Access Memory (RAM), Read-Only Memory (ROM), Flash memory (e.g., a Secure Digital (SD) memory card, a mini-SD memory card, and/or a micro-SD memory card), magnetic memory, optical memory, a Universal Serial Bus (USB) memory device, hard disk memory, external memory, and other types of computer-readable storage media. In implementations, the fingerprint sensor 100 and/or memory 134 may include removable Integrated Circuit Card (ICC) memory, such as memory provided by a Subscriber Identity Module (SIM) card, a Universal Subscriber Identity Module (USIM) card, a Universal Integrated Circuit Card (UICC), and so on.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A sensor assembly, comprising:
   a controller;
   a metal layer configured to be electrically coupled to the controller;
   a sensor glass layer;
   a transmit layer electrically connected to the metal layer and the controller, the transmit layer being disposed on a first side of the sensor glass layer, the transmit layer being configured to transmit an electric field;
   a receive layer disposed on a second side of the sensor glass layer, the receive layer being electrically coupled to the metal layer, the receive layer being configured to detect changes in the electric field; and
   a protective cover layer disposed on the receive layer.

2. The sensor assembly of claim 1, wherein at least one of the receive layer or the transmit layer includes a transparent conductor.

3. The sensor assembly of claim 1, wherein the receive layer includes receive lines and the transmit layer includes transmit lines and wherein the controller is configured to detect changes in mutual capacitance between the receive lines and the transmit lines.

4. The sensor assembly of claim 1, wherein the controller is configured to provide signals in a range of 50 KHz to 10 MHz to the transmit layer.

5. The sensor assembly of claim 1, wherein the controller is configured for at least one of hover detection and gesture detection.

6. The sensor assembly of claim 1, wherein the receive layer includes multiple receive elements and the transmit layer includes multiple transmit elements and wherein the controller is configured to operate in a low-spatial-resolution mode by ganging together multiple transmit elements of the transmit layer and multiple receive elements of the receive layer.

7. The sensor assembly of claim 1, further comprising a fingerprint sensing portion, wherein the controller is configured for fingerprint detection.

8. The sensor assembly of claim 7, wherein in the fingerprint sensing portion, a pitch of elements of the transmit layer and of the receive layer is in a range of 50 microns to 100 microns.

9. The sensor assembly of claim 1, further comprising a flexible cable, wherein the metal layer is configured to electrically connect the controller to the flexible cable.

10. The sensor assembly of claim 1, further comprising a flexible cable configured for electrical connection with at least one of the receive layer or the transmit layer.

11. The sensor assembly of claim 10, wherein the flexible cable is configured for electrical communication with a motherboard.

12. The sensor assembly of claim 1, further comprising a blind via that extends from the first side of the sensor glass layer to the second side of the sensor glass layer, where the blind via is configured to provide capacitive coupling between the transmit layer and the receive layer.

13. The sensor assembly of claim 1, further comprising at least one through-substrate via in the sensor glass layer, the through-substrate via being electrically coupled to at least one of the transmit layer or the receive layer.

14. A mobile device, comprising:
   a display assembly;
   a controller configured for electrical connectivity with the display assembly;
   a sensor glass layer;
   a transmit layer disposed on a first side of the sensor glass layer, the transmit layer being electrically connected to the controller, the transmit layer being configured to transmit an electric field;
   a receive layer disposed on a second side of the sensor glass layer, the receive layer being electrically coupled to controller, the receive layer being configured to detect changes in the electric field; and
   a protective cover layer disposed on the receive layer.

15. The mobile device of claim 14, where the display assembly includes at least one of a liquid crystal display or an organic light-emitting diode display.

16. The mobile device of claim 14, wherein the controller is configured to detect changes in mutual capacitance between lines of the receive layer and lines of the transmit layer.

17. The mobile device of claim 16, wherein the controller is configured for touch detection.

18. The mobile device of claim 16, wherein the controller is configured for at least one of hover detection and gesture detection.

19. The mobile device of claim 16, wherein the controller is configured to operate in a low-spatial-resolution mode by ganging together multiple transmit elements of the transmit layer and multiple receive elements of the receive layer.

20. The mobile device of claim 16, further comprising a fingerprint sensing portion, wherein the controller is configured for fingerprint detection.

21. The mobile device of claim 20, wherein in the fingerprint sensing portion, a pitch of elements of the transmit layer and of the receive layer is in a range of 50 microns to 100 microns.

22. The mobile device of claim 20, wherein the fingerprint sensing portion is disposed between a portion of the display assembly and the protective cover layer.

23. The mobile device of claim 20, wherein an area occupied by the fingerprint sensing portion is smaller than an area occupied by the protective cover layer.

24. The mobile device of claim 14, wherein the controller is configured to provide signals in a range of 50 KHz to 10 MHz to the transmit layer.

25. The mobile device of claim 14, wherein at least one of the receive layer or the transmit layer includes a transparent conductor.

26. The mobile device of claim 14, further including a through-substrate via in the sensor glass layer, the through-substrate via being electrically coupled to at least one of the transmit layer or the receive layer.

* * * * *